(12) United States Patent
Margetts

(10) Patent No.: US 10,365,967 B2
(45) Date of Patent: Jul. 30, 2019

(54) ON THE FLY RAID PARITY CALCULATION

(71) Applicant: Toshiba Memory Corporation, Minato-ku, Tokyo (JP)

(72) Inventor: Julien Margetts, Thame (GB)

(73) Assignee: Toshiba Memory Corporation, Tokyo (JP)

(*) Notice: Subject to any disclaimer, the term of this patent is extended or adjusted under 35 U.S.C. 154(b) by 6 days.

(21) Appl. No.: 15/684,649

(22) Filed: Aug. 23, 2017

(65) Prior Publication Data

US 2019/0065306 A1 Feb. 28, 2019

(51) Int. Cl.
G11C 29/00 (2006.01)
G06F 11/10 (2006.01)
G11C 29/52 (2006.01)

(52) U.S. Cl.
CPC ...... *G06F 11/1068* (2013.01); *G06F 11/1076* (2013.01); *G11C 29/52* (2013.01)

(58) Field of Classification Search
CPC .............................. G06F 11/1068; G11C 29/52
See application file for complete search history.

(56) References Cited

U.S. PATENT DOCUMENTS

| | | | |
|---|---|---|---|
| 6,151,641 A | 11/2000 | Herbert | |
| 6,161,165 A | 12/2000 | Solomon et al. | |
| 6,237,052 B1 | 5/2001 | Stolowitz | |
| 8,065,590 B2 | 11/2011 | Stolowitz | |
| 8,468,301 B2 | 6/2013 | Withers | |
| 8,694,865 B2 | 4/2014 | Baek et al. | |
| 8,977,813 B2 | 3/2015 | Burd | |
| 2005/0138191 A1 | 6/2005 | Seto et al. | |
| 2007/0226360 A1 | 9/2007 | Gupta et al. | |

(Continued)

FOREIGN PATENT DOCUMENTS

| TW | 200410214 A | 6/2004 |
|---|---|---|
| TW | 200410216 A | 6/2004 |
| TW | 200723093 A | 6/2007 |

OTHER PUBLICATIONS

Yongkun Li et al., "Elastic Parity Logging for SSD RAID Arrays", 12 pages, (2016).

(Continued)

*Primary Examiner* — Samir W Rizk
(74) *Attorney, Agent, or Firm* — White & Case LLP

(57) ABSTRACT

A data storage device comprises a nonvolatile semiconductor storage array containing data, a controller in communication with the nonvolatile semiconductor storage array, and a buffer containing RAID units, the RAID units being in communication with the nonvolatile semiconductor storage array via the controller. The controller is configured to receive write requests from a host device, and accumulate first data relating to the write requests in the RAID units. The controller is also configured to, concurrently, transfer the first data contained in the RAID units to the nonvolatile semiconductor storage array, calculate parity values of the first data contained in the RAID units, each parity value relating to each write request, and accumulate the parity values in a context identifier buffer. The controller is further configured to associate context identifiers with the parity values, and store the parity values and the context identifiers in the nonvolatile semiconductor storage array.

26 Claims, 14 Drawing Sheets

(56) References Cited

U.S. PATENT DOCUMENTS

2012/0254694 A1 10/2012 Golov et al.
2016/0246678 A1* 8/2016 Galbraith .............. G06F 3/0619

OTHER PUBLICATIONS

Ching-Che Chung., "Partial Parity Cache and Data Cache Management Method to Improve the Performance of an SSD-Based RAID", IEEE Transactions on Very Large Scale Integration (VLSI) Systems, vol. 22, No. 7, pp. 1470-1480, (Jul. 2014).
Taiwanese Office Action dated Apr. 29, 2019 in corresponding Taiwanese Application No. 107128343, along with English translation.

* cited by examiner

| | Data (Page, Part) | Final | Parity Context Y | Page Bitmap | Offset Bitmap |
|---|---|---|---|---|---|
| 250 | Init | | X1,X2,X3,X4 | 1111 | 0000 |
| 251 | P1 | | X1,X2,X3,P1 | 1111 | 0001 |
| 252 | Q1 | | X1,X2,X3,{P1⊕Q1} | 1111 | 0001 |
| 253 | P2 | | X1,X2,P2,{P1⊕Q1} | 1111 | 0011 |
| 254 | R1 | | X1,X2,P2,{P1⊕Q1⊕R1} | 1111 | 0011 |
| 255 | S1 | | X1,X2,P2,{P1⊕Q1⊕R1⊕S1} | 1111 | 0011 |
| 256 | Q2 | | X1,X2,{P2⊕Q2},{P1⊕Q1⊕R1⊕S1} | 1111 | 0011 |
| 257 | P3 | | X1,P3,{P2⊕Q2},{P1⊕Q1⊕R1⊕S1} | 1111 | 0111 |
| 258 | P4 | F | P4,P3,{P2⊕Q2},{P1⊕Q1⊕R1⊕S1} | 1110 | 1111 |
| 259 | R2 | | P4,P3,{P2⊕Q2⊕R2},{P1⊕Q1⊕R1⊕S1} | 1110 | 1111 |
| 260 | S2 | | P4,P3,{P2⊕Q2⊕R2⊕S2},{P1⊕Q1⊕R1⊕S1} | 1110 | 1111 |
| 261 | R3 | | P4,{P3⊕R3},{P2⊕Q2⊕R2⊕S2},{P1⊕Q1⊕R1⊕S1} | 1110 | 1111 |
| 262 | S3 | | P4,{P3⊕R3⊕S3},{P2⊕Q2⊕R2⊕S2},{P1⊕Q1⊕R1⊕S1} | 1110 | 1111 |
| 263 | R4 | F | {P4⊕R4},{P3⊕R3⊕S3},{P2⊕Q2⊕R2⊕S2},{P1⊕Q1⊕R1⊕S1} | 1010 | 1111 |
| 264 | Q3 | | {P4⊕R4},{P3⊕R3⊕S3⊕Q3},{P2⊕Q2⊕R2⊕S2},{P1⊕Q1⊕R1⊕S1} | 1010 | 1111 |
| 265 | Q4 | F | {P4⊕R4⊕Q4},{P3⊕R3⊕S3⊕Q3},{P2⊕Q2⊕R2⊕S2},{P1⊕Q1⊕R1⊕S1} | 1000 | 1111 |
| 266 | S4 | F | {P4⊕R4⊕Q4⊕S4},{P3⊕R3⊕S3⊕Q3},{P2⊕Q2⊕R2⊕S2},{P1⊕Q1⊕R1⊕S1} | 0000 | 1111 |

FIG. 2B

ON THE FLY RAID PARITY CALCULATION

FIELD OF THE INVENTION

The present disclosure relates to solid-state drives and methods that perform on the fly parity calculation to improve the efficiency of the drive.

BACKGROUND

A solid-state drive (SSD) generally has faster performance, is more compact, and is less sensitive to vibration or physical shock than a conventional magnetic disk drive. Given these advantages, SSDs are being used in more and more computing devices and other consumer products in lieu of or in addition to magnetic disk drives, even though the cost-per-gigabyte storage capacity of SSDs is significantly higher than that of magnetic disk drives.

Data is stored in SSDs in many ways to optimize the quality of data during read and write cycles. RAID (redundant array of independent disks) is one example of a data storage virtualization technology that combines multiple SSD components into a single logical unit for the purposes of data redundancy, performance improvement, or both. Data is distributed across the SSDs according to several distribution layouts, known as RAID levels, depending on the required level of data redundancy and desired performance. RAID levels are numbered and currently range from RAID 0 to RAID 6, each of which provide a different balance amongst the key objectives of data storage in SSDs—reliability, availability, performance and capacity. RAID levels greater than RAID 0 provide protection against unrecoverable sector read errors, as well as against failures of whole physical drives.

RAID technology may also be deployed within an SSD, where an SSD controller may assume the additional role of a RAID controller and distribute data across multiple nonvolatile memory devices within the SSD in the same way that RAID may be deployed across multiple SSDs. In this case, RAID provides protection against failures of individual memory devices or unrecoverable memory device errors when memory device error rates exceed the error correcting capability of SSD controller error correcting codes (ECC).

Of the several RAID levels available, the RAID 5 distribution layout is well suited for SSDs for optimal data retention during read and write operations. This is because the RAID 5 distribution layout incorporates parity information that is distributed amongst all the drives. In the same way, with RAID deployed within an SSD, RAID 5 data with parity information is written in stripes and distributed across a set of memory devices. With NAND flash non-volatile memory devices, data is also written with ECC parity information which is used to detect and correct NAND flash memory read and write errors and generally utilizes parity bits generated from error correcting codes (ECC) embedded in data transmitted from the SSD controller to the NAND flash memory device. Upon failure of a single device, lost data can be recovered using the distributed data and parity of the RAID stripe, via the Boolean operation XOR with data stored in the remaining memory devices, thereby facilitating subsequent read cycles without any loss of data. Other RAID distributions may also be employed within SSDs to meet specified requirements.

RAID data distribution layouts currently used within SSDs employ synchronous data activity where read and write requests obtained from a hosts are processed sequentially. Such synchronous activity involves the read of all data stored in a buffer in order to generate parity information or reconstruct data after unrecoverable errors, which may be time consuming and which would unnecessarily add stress to the memory controller of an SSD. In view of this, there remains a long felt need for optimized data read and write operations performed by a RAID enabled SSD controller which is less taxing on the SSD controller.

SUMMARY OF INVENTION

The present disclosure relates to a data storage device comprising a nonvolatile semiconductor storage array containing data, a controller in communication with the nonvolatile semiconductor storage array, and a buffer containing RAID units, the RAID units being in communication with the nonvolatile semiconductor storage array via the controller. The controller is configured to receive write requests from a host device, and accumulate first data relating to the write requests in the RAID units. The controller is also configured to concurrently (i) transfer the first data contained in the RAID units to the nonvolatile semiconductor storage array, (ii) calculate parity values of the first data contained in the RAID units, each parity value relating to each write request, (iii) accumulate the parity values in a context identifier buffer, (iv) associate context identifiers with the parity values, and (v) store the parity values and the context identifiers in the nonvolatile semiconductor storage array.

In certain implementations, the first data comprises first data pages that are divided into first data parts. In other implementations, the parity values are calculated using the first data parts. In some implementations, the context identifier buffer calculates the parity values using the same first data parts of all the first data pages. In certain implementations, the parity value is calculated by performing a logical XOR operation using the same first data parts of all the first data pages contained in the context identifier buffer. In other implementations, the controller is further configured to allocate an identifier to the first data contained in each RAID unit. In some implementations, the identifiers comprise at least one of: a final flag, a page bitmap and an offset bitmap. In certain implementations, the first data in each RAID unit is stored with the identifier in the nonvolatile semiconductor storage array. In other implementations, the buffer is a DRAM buffer. In some implementations, the RAID units are implemented as RAID 5.

The present disclosure also relates to a data storage device comprising a nonvolatile semiconductor storage array containing first data, a controller in communication with the nonvolatile semiconductor storage array, and a buffer containing RAID units, the RAID units being in communication with the nonvolatile semiconductor storage array via the controller. The controller is configured to (i) receive a read request from a host device for a second data stored in the nonvolatile semiconductor storage array, (ii) determine an identifier associated with the requested second data, (iii) determine if the requested second data contains an unrecoverable error, (iv) accumulate first data, including a parity value, contained in the nonvolatile semiconductor storage array associated with the same identifier as the requested second data in a reconstruction buffer, if the requested second data contains an unrecoverable error, (v) reconstruct the requested second data from the accumulated first data and the parity value, and (vi) transfer the reconstructed second data to the host device via the RAID units.

In certain implementations, the requested second data is reconstructed by performing a logical XOR operation on the accumulated first data and the parity value. In other implementations, the controller determines the location of the requested second data in the nonvolatile semiconductor storage array using a look up table. In some implementations, the buffer is a DRAM buffer. In certain implementations, the RAID units are implemented as RAID 5.

The present disclosure also relates to a method comprising receiving, by a controller in communication with a nonvolatile semiconductor storage array, a write request from a host device. The method also includes accumulating first data related to the write request in RAID units contained in a buffer, the buffer being in communication with the nonvolatile semiconductor storage array via the controller. Further, the method concurrently (i) transfers the first data contained in the RAID units to the nonvolatile semiconductor storage array, (ii) calculates parity values from the first data contained in the RAID units, each parity value relating to each write request, (iii) accumulates the parity values in a context identifier buffer, (iv) associates context identifiers with the parity values, and (v) stores the parity values and the context identifiers in the nonvolatile semiconductor storage array.

In certain implementations, the first data comprises first data pages that are divided into first data parts. In other implementations, the method further comprises calculating the parity values using the first data parts. In some implementations, the context identifier buffer calculates the parity values using the same first data parts of all the first data pages. In certain implementations, the parity value is calculated by performing a logical XOR operation using the same first data parts of all the first data pages contained in the context identifier buffer. In other implementations, the method further comprises allocating an identifier to the first data contained in each RAID unit.

The present disclosure also relates to a method comprising receiving, by a controller in communication with a nonvolatile semiconductor storage array, a read request from a host device for second data stored in the nonvolatile semiconductor storage array. The method also comprises determining an identifier associated with the requested second data, and determining if the requested second data contains an unrecoverable error. The method further comprises accumulating first data, including a parity value, contained in the nonvolatile semiconductor storage array associated with the same identifier as the requested second data in a reconstruction buffer, if the requested second data contains an unrecoverable error. The method also comprises reconstructing the requested second data from the accumulated first data and the parity value, and transferring the reconstructed second data to the host device via the RAID units.

In certain implementations, the method further comprises performing a logical XOR operation on the first data and the parity value. In other implementations, the controller determines the location of the requested second data in the nonvolatile semiconductor storage array using a look up table.

The present disclosure also relates to a non-transitory computer-readable medium storing instructions that, when executed by a processor, cause the processor to perform a method comprising receiving, by a controller in communication with a nonvolatile semiconductor storage array, a write request from a host device. The method also comprises accumulating first data related to the write request in RAID units contained in a buffer, the buffer being in communication with the nonvolatile semiconductor storage array via the controller. The method also concurrently (i) transfers the first data contained in the RAID units to the nonvolatile semiconductor storage array, (ii) calculates parity values from the first data contained in the RAID units, each parity value relating to each write request, (iii) accumulating the parity values in a context identifier buffer, (iv) associates context identifiers with the parity values, and (v) stores the parity values and the context identifiers in the nonvolatile semiconductor storage array.

The present disclosure also relates to a non-transitory computer-readable medium storing instructions that, when executed by a processor, cause the processor to perform a method comprising receiving, by a controller in communication with a nonvolatile semiconductor storage array, a read request from a host device for second data stored in the nonvolatile semiconductor storage array. The method also comprises the steps of determining an identifier associated with the requested second data, and determining if the requested second data contains an unrecoverable error. The method also comprises accumulating first data, including a parity value, contained in the nonvolatile semiconductor storage array associated with the same identifier as the requested second data in a reconstruction buffer, if the requested second data contains an unrecoverable error. Further, the method comprises the steps of reconstructing the requested second data from the accumulated first data and the parity value, and transferring the reconstructed second data to the host device via the RAID units.

BRIEF DESCRIPTION OF THE DRAWINGS

The foregoing and other objects and advantages will be apparent upon consideration of the following detailed description, taken in conjunction with the accompanying drawings, in which like reference characters refer to like parts throughout, and in which:

FIG. 2B illustrates an exemplary calculation of the parity buffer when writing data, according to an embodiment of the present disclosure;

DETAILED DESCRIPTION

Figure 1:
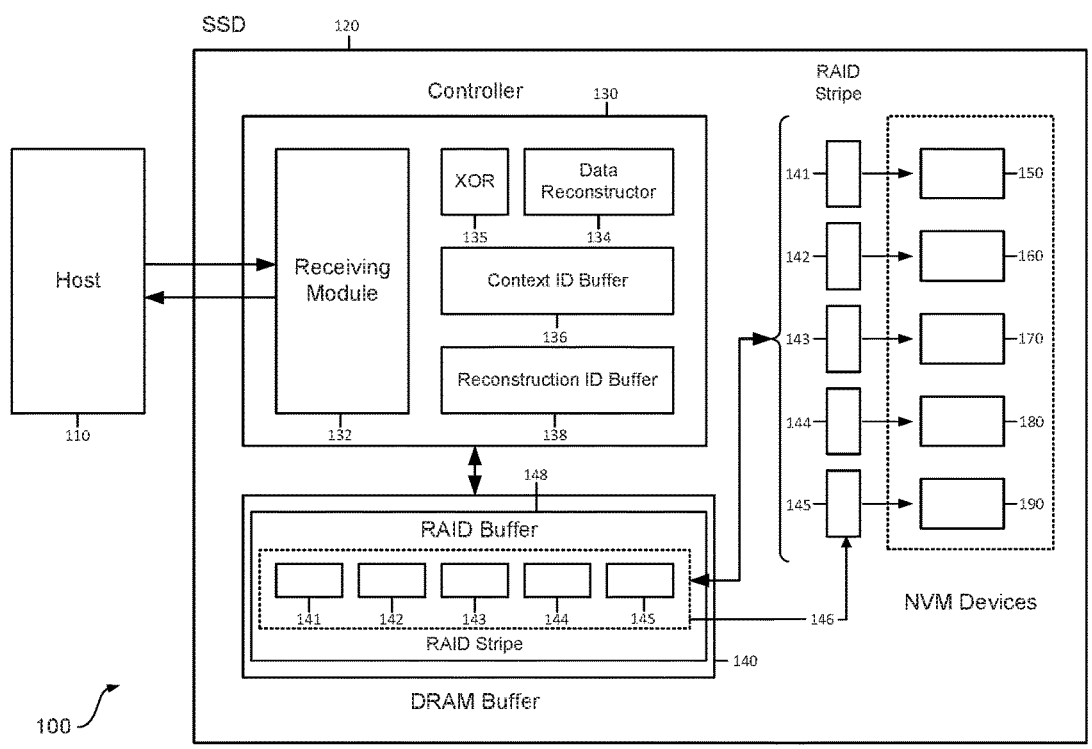
FIG. 1 shows a schematic representation of a solid-state drive (SSD), according to one or more embodiments of the present disclosure.

FIG. 1 is a block diagram of a computing system 100 comprising at least one host 110 in communication with a storage device 120. The host 110 is a computing system that comprises processors, memory, and other components as are generally known and is not shown in FIG. 1 for the sake of brevity. For example, the host 110 may be a SATA, PCI Express (PCIe) or an NVM Express (NVMe™) host. Storage device 120 provides nonvolatile storage functionality for use by the host 110. Storage device 120 is a solid-state drive ("SSD"), which is a nonvolatile storage device that includes nonvolatile semiconductor-based storage elements (such as NAND-based flash memory devices) as the storage medium. Storage device 120 includes a nonvolatile memory (NVM) controller 130, a DRAM buffer 140 and nonvolatile (NV) semiconductor memory 150. Storage device 120 may also include other elements not shown, such as volatile memory for caching and buffering, power supply circuitry (including circuitry for transferring power to the SSD controller 130, DRAM buffer 140 and the NV semiconductor memory 150 as well as capacitors for buffering the power supply), indicator light circuitry, temperature sensors, boot circuitry, clock circuitry, and other circuitry for assisting with various functions.

The SSD controller 130 comprises a receiving module 132 for receiving requests (e.g. read and write) from the host 110. The receiving module 132 may be a data transponder, for example. The controller 130 also comprises a data re-constructor 134 coupled to an XOR module 135 for recovering data lost due to a failure in any of the disks of the NV memory 150. The data re-constructor 134 may comprise a processor capable of effecting logical calculations, for example. The controller 130 may also comprise a context ID buffer 136 and a re-construction ID buffer 138 to facilitate with the data re-construction as will be detailed in the following paragraphs. While the data re-constructor 134, XOR module 135, context ID buffer and reconstruction ID buffer 138 are shown as single units, it will be appreciated that any implementation of the present disclosure may include a plurality of these modules.

SSD controller 130 receives and processes commands from the host 110 in order to perform operations on the DRAM buffer 140 and the NV semiconductor memory 150. Commands from host 110 include requests to read or write to locations within the NV semiconductor memory, and various administrative commands, such as commands for querying the feature set of storage device 120, commands for formatting the NV semiconductor memory, commands for creating and modifying various types of queues, commands for requesting notification of various events, and various other commands. NV semiconductor memory includes one or more arrays of nonvolatile semiconductor-based storage elements (such as storage elements 150, 160, 170, 180, 190), some examples of which include nonvolatile NAND flash memory, nonvolatile NOR flash memory, nonvolatile DRAM based memory (NVDIMM), magnetoresistive and resistive random-access memory (MRAM and ReRAM), phase change memory (PCM), and other types of memory. A portion of the DRAM buffer 140 is used as a RAID stripe 146 where volatile memory blocks 141-145 are allocated to the RAID stripe 146. The memory blocks 141-144 are used to buffer data received from the host 110, with one memory block 145 being used to store a parity value Y calculated from the data retrieved from the NV memory. The DRAM buffer 140 also comprises a RAID buffer 148 which may hold several RAID stripes each with memory blocks 141-145 (not shown for clarity).

Figure 2A:
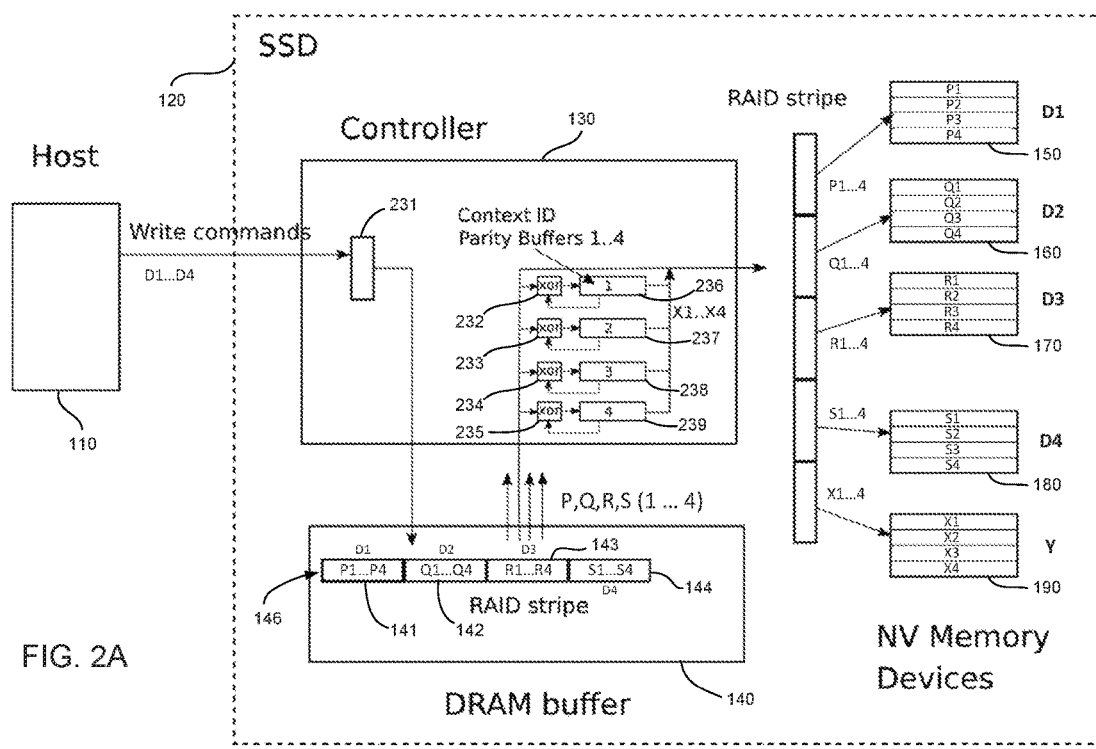
FIG. 2A illustrates a technique of writing data from a host device to the SSD of FIG. 1, according to an embodiment of the present disclosure.

FIG. 2A illustrates a method of writing data to the NV memory 150 with RAID protection according to an embodiment of the present disclosure. Here a write command is received from the host 110 to the NV memory 150. One or more such write commands comprise data in the form of data pages D1-D4 received from the host 110. A write command may contain data for only one portion of a data page, or may contain data that spans several data pages. The write commands may also comprise logical address information related to the target NV memory devices 150, 160, 170, 180, 190. A write command is received by the controller 130 of the SSD 120 via the receiving module 231. The data pages D1-D4 from one or more write commands are then buffered in the RAID buffer 141-144 within the DRAM buffer 140, such that data pages D1-D4 are accumulated in a RAID stripe 146. Each page of data D1-D4 is buffered by a page buffer specific to each disk of the DRAM buffer 140. Data pages D1-D4 are then stored in DRAM units 141-144 that form the RAID stripe 146. Once the data pages D1-D4 are buffered into the DRAM 140, the data pages D1-D4 are read by the controller 130 to be written to the NV memory devices 150, 160, 170, 180. Note that in FIG. 2A, there are a plurality of XOR modules 232-235, and a plurality of context ID buffers 236-239. The controller 130 reads the data pages D1-D4 in the RAID stripe 146 of the DRAM buffer 140 and feeds this information into the XOR modules 232-235, as will be explained below.

Each data page D1-D4 comprises several parts. In the example shown in FIG. 2A, data page D1 comprises parts P1-P4. Similarly, data page D2 comprises parts Q1-Q4, data page D3 comprises parts R1-R4, and data page D4 comprises parts S1-S4. While each page D1-D4 in FIG. 2A comprises four parts, it will be understood that each data page can comprise a plurality of $2^n$ parts, where n is an integer.

When the controller 130 reads the data pages D1-D4 from the RAID stripe 146, a new context identifier C_ID is allocated to the information read into each of the XOR modules 232-235. This C_ID is unique to each part of each data page D1-D4 read from the RAID stripe 146 by the controller 130. The C_ID is linked to the address being used to reference the data pages D1-D4 in the NV memory devices 150, 160, 170, 180, 190. Context identifier parity buffers 236-239 are associated with each XOR module 232-235. Thus, for example, when D1 is read by the controller 130, data parts P1-P4 are written to the NVM device 150. At the same time, data parts P1-P4 that make up data page D1 are successively read into XOR modules 232-235 which performs an XOR operation and outputs a value into a corresponding context ID buffer 236-239. For example, when D1 is read by the controller 130, P1 is read by XOR module 232, P2 is read by XOR module 233, P3 is read by XOR module 234, and P4 is read by XOR module 235. The buffers 236-239 initially do not contain any data, and so when data parts P1-P4 are received by each of the buffers 236-239, these data parts are deemed the first data in the buffers 236-239, and so the parity buffers 236-239 are initialized with the data parts P1-P4. In this example, data part P1 initializes parity buffer 236, data part P2 initializes parity buffer 237, data part P3 initializes parity buffer 238, and data part P4 initializes parity buffer 239. It should be noted that similar data parts of data pages P, Q, R and S are received by the same parity buffer, i.e. P1, Q1, R1 and S1 are received by parity buffer 236, P2, Q2, R2 and S2 are received by parity buffer 237, P3, Q3, R3 and S3 are received by parity buffer 238, and P4, Q4, R4 and S4 are received by parity buffer 239. It should also be noted that while P1-P4 are described as first received by the buffers 236-239, any of P1-P4, Q1-Q4, R1-R4 and S1-S4 can be first received by the buffers 236-239. Thus as another example, data part Q1 initializes parity buffer 236, data part P1 initializes parity buffer 237, data part S1 initializes parity buffer 238, and data part P2 initializes parity buffer 239. Thus while data parts within the same page must be read in sequence, the order or reading the data pages is not fixed.

Data pages D1-D4 can be read by the controller 130 in any order and/or concurrently. Thus while page D1 is read as the first data page, as described above, any of the remaining pages D2-D4 may be read as the first data page by the controller 130. For example, the data pages may be read by the controller 130 in the order D2, D4, D1 and D3. In another example, the data pages may be read in the order D4//D2, D3 and D1. While the order in which the data pages D1-D4 are read is of no importance, when any one data page D1-D4 is read, the corresponding data parts P1-P4, Q1-Q4, R1-R4 and S1-S4 must each be read in order. For example, when data page D1 is read in by the controller 130, P1 must be read into XOR module 232 (and subsequently parity buffer 236), P2 must be ready into XOR module 233 (and subsequently parity buffer 237), P3 must be read into XOR module 234 (and subsequently parity buffer 238), and P4 must be read into XOR module 235 (and subsequently parity buffer 239). As a further example, when data page D3 is ready in by the controller 130, R1 must be read into XOR module 232 (and subsequently parity buffer 236), R2 must be ready into XOR module 233 (and subsequently parity buffer 237), R3 must be read into XOR module 234 (and subsequently parity buffer 238), and R4 must be read into XOR module 235 (and subsequently parity buffer 239).

Once the parity buffers 236-239 are initialized with a data parts P1-P4 from data page D1, as subsequent data pages D2-D4 are read by the controller 130, their composite data parts Q1-Q4, R1-R4 and S1-S4 are XORed with the contents of the respective parity buffers 236-239. For example, if the data page D3 is read in by the controller 130, parity buffer 236 will contain P1⊕R1, parity buffer 237 will contain P2⊕R2, parity buffer 238 will contain P3⊕R3, and parity buffer 239 will contain P4⊕R4. As a further example, if the data page D2 is read in by the controller 130 subsequent to data pages D1 and D3, parity buffer 236 will contain P1⊕R1⊕Q1, parity buffer 237 will contain P2⊕R2⊕Q2, parity buffer 238 will contain P3⊕R3⊕Q3, and parity buffer 239 will contain P4⊕R4⊕Q4. It will be understood that if data page D2 only contained parts Q1-Q2 and data page D3 only contains data parts R1-R3, then the parity buffer 236 will contain P1⊕R1⊕Q1, parity buffer 237 will contain P2⊕R2⊕Q2, parity buffer 238 will contain P3⊕R3, and parity buffer 239 will contain P4.

After all the data pages D1-D4 are read by the controller 130, the corresponding data parts P1-P4, Q1-Q4, R1-R4 and S1-S4 are stored in the NV memories 150, 160, 170 and 180 as depicted in FIG. 2A. The contents of the parity buffers 236-239 are also stored in NV memory 190. In the case where data pages D1-D4 each contain four parts of data, the parity contents of NV memory 190 are:

X1=P1⊕Q1⊕R1⊕S1, X2=P2⊕Q2⊕R2⊕S2, X3=P3⊕Q3⊕R3⊕S3, and X4=P4⊕Q4⊕R4⊕S4.

FIG. 2B illustrates the state of the parity buffers 236-239 as data is read by the controller 130. Before receiving a write command from the host 110, the controller 130 initializes the parity buffers 236-239 by setting a page bitmap to '1' an offset bitmap to '0'. For $2^n$ pages of data to be written, the page and offset bitmaps would each be $2^{11}$ bytes long. Thus for the worked example discussed above, with four pages D1, D2, D3, D4 of data, the page bitmap would be initialized at '1111' and the offset bitmap would be initialized at '0000'. This is shown in row 250 of the table in FIG. 2B. Each time the controller 130 reads in data to be written to the NV memory devices 150, 160, 170, 180, it checks if the offset bitmap is initialized at '0000'. If it is, the controller then proceeds to initialize the parity buffers 236-239 to zero as well. This would be the situation in row 250 of FIG. 2B with X1=0, X2=0, X3=0 and X4=0.

If the offset bitmap is not zero, then the controller 130 begins to transfer data to the NV memory devices 150, 160, 170, 180, and, at the same time, XOR the data with the respective parity buffers 236-239. Thus when data part P1 is received by the SSD 120, the controller transfers the received data to the NV memory device 150 and the XOR module 232. The XOR module 232 then XORs P1 with the contents of the parity buffer 236. As depicted in row 251 of FIG. 2B, the parity buffer is freshly initialized, and thus the contents of parity buffer would be X1=P1⊕0=P1. When the parity buffer 236 for the first part (P1) of the data pages is received by the parity buffer 236 for the first time, the offset bitmap is incremented to '0001', as indicated in row 251 in FIG. 2B. Thus when second part (P2) of the data pages is received by the parity buffer 237 for the first time, as in row 253 in FIG. 2B, the offset bitmap is incremented further to '0011'. Similarly, when the third part (P3) of the data pages is received by the parity buffer 238 for the first time, as in row 257 in FIG. 2B, the offset bitmap is incremented further to '0111'. Finally, when the fourth part (P4) of the data pages is received by the parity buffer 239 for the first time, as in row 258 in FIG. 2B, the offset bitmap is incremented further to '1111'.

It should be noted that the similar part of each data page D1, D2, D3, D4 is received by the same XOR module and parity buffer. Therefore in FIG. 2B, P1, Q1, R1 and S1 are received by XOR module 232 and parity buffer 236, P2, Q2, R2 and S2 are received by XOR module 233 and parity buffer 237, P3, Q3, R3 and S3 are received by XOR module 234 and parity buffer 238, and P4, Q4, R4 and S4 are received by XOR module 235 and parity buffer 239.

Once all the data in a data page has been received by the controller 130, e.g. all of of D1 (P1, P2, P3 and P4) has been received, a final flag is set to '1' within the controller to indicate that all data has been written to the NV memory device 150 and the parity buffers 236-239 have been updated. When this happens, the page bitmap is decremented from '1111' to '1110' as shown in row 258 of FIG. 2B. Similarly, when all of D2 (Q1, Q2, Q3 and Q4) is received, the final flag is set to '1' and the page bitmap is updated to '1010' to indicate that all the data has been written to NV memory device 160 and the parity buffers 236-239 have been updated. When all of D3 (R1, R2, R3 and R4) is received, the final flag is set to '1' and the page bitmap is updated to '1000' to indicate that all the data has been written to NV memory device 160 and the parity buffers 236-239 have been updated. Also when all of D4 (S1, S2, S3 and S4) is received, the final flag is set to '1' and the page bitmap is cleared to '0000' to indicate that all the data has been written to NV memory device 160 and the parity buffers 236-239 have been updated. When all the data pages D1, D2, D3, D4 have been written to the NV memory devices 150, 160, 170 and 180, the parity buffers 236-239 are full and contain X1=P1⊕Q1⊕R1⊕S1, X2=P2⊕Q2⊕R2⊕S2, X3=P3⊕Q3⊕R3⊕S3, and X4=P4⊕Q4⊕R4⊕S4, as per row 266 in FIG. 2B. The contents X1, X2, X3 and X4 of the parity buffers 236-239 are then written to the NV memory device 190.

Figure 3A:
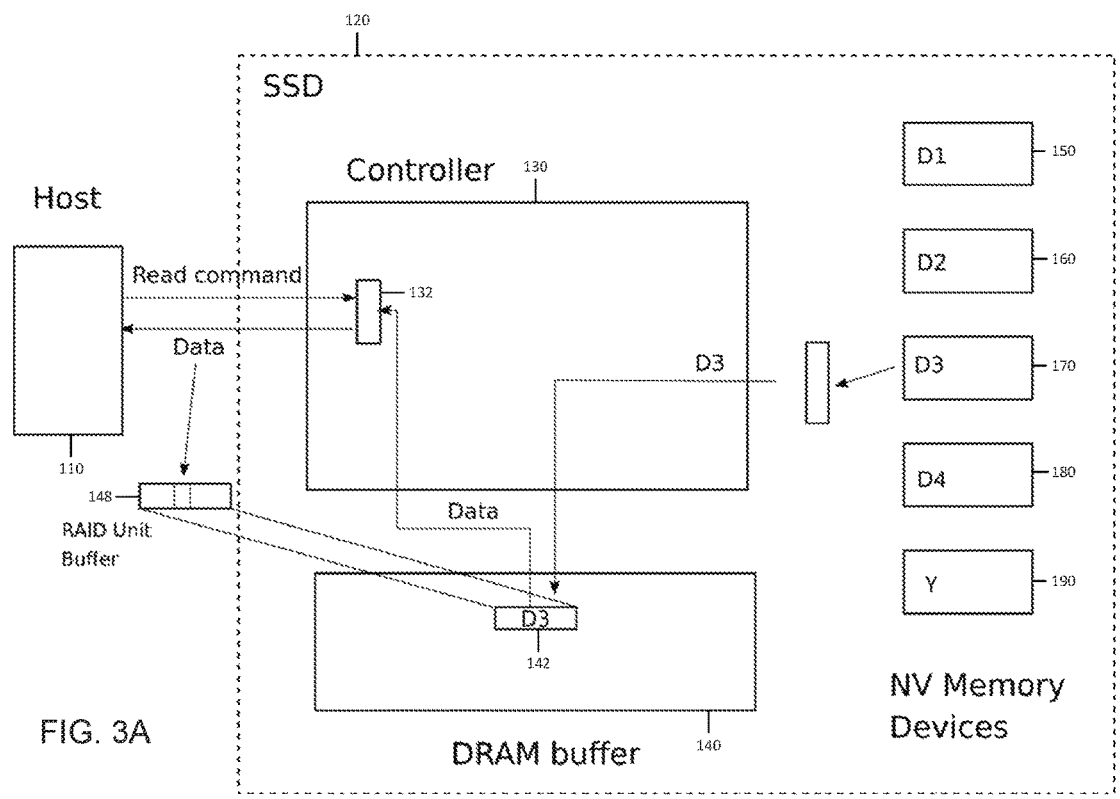
FIG. 3A illustrates a technique of reading data back to the host device from the SSD in FIG. 1 where no error is detected, according to an embodiment of the present disclosure.

FIG. 3A illustrates the process of reading data from the NV memory 150 to the host 110 according to an embodiment of the present disclosure. A read command issued by the host 110 is received by the receiving module 132 of the controller 130. The controller 130 interprets the read command and locates the requested data in the NV memory 150. As an example, if the requested data is located within data page D3 (i.e. contained in any of data parts R1-R4), the controller 130 would locate the data page D3 in NV memory device 150 (via a lookup table stored in the controller 130, for example) and transfer the data page D3 to the DRAM buffer 140 to be returned to the host 110.

Figure 3B:
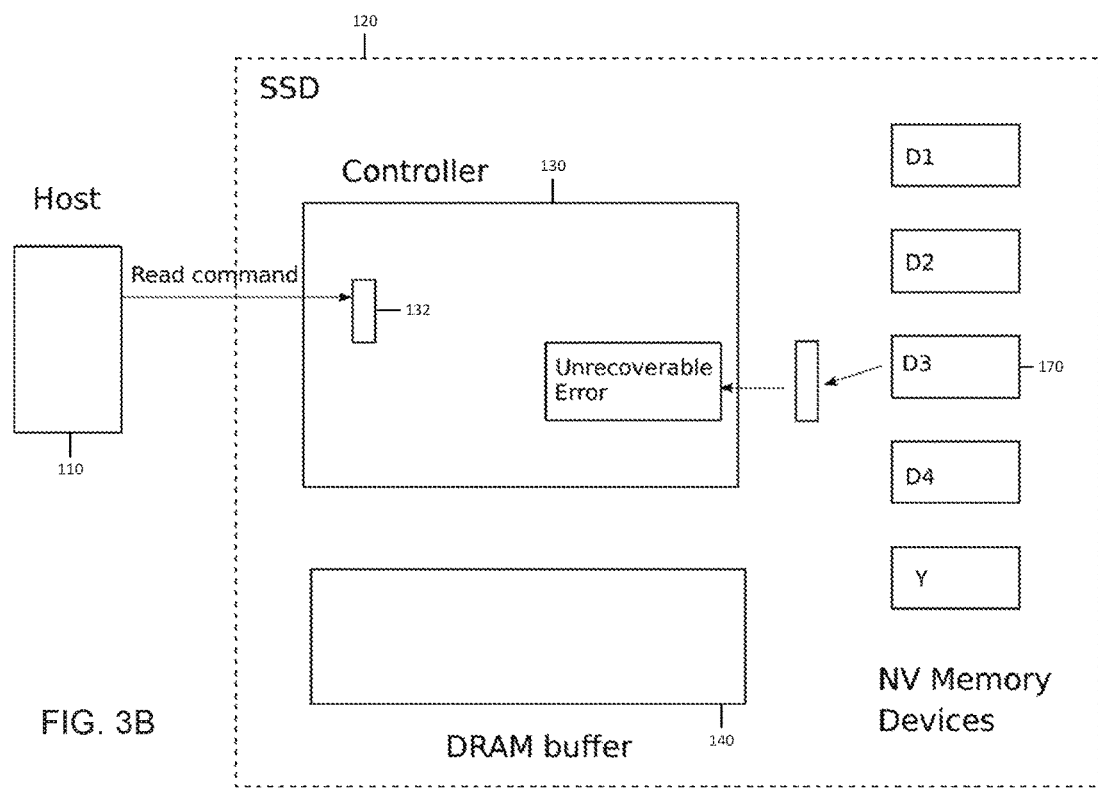
FIG. 3B illustrates a technique of reading data back to the host device from the SSD in FIG. 1 where an unrecoverable error is detected, according to an embodiment of the present disclosure.
Figure 3C:
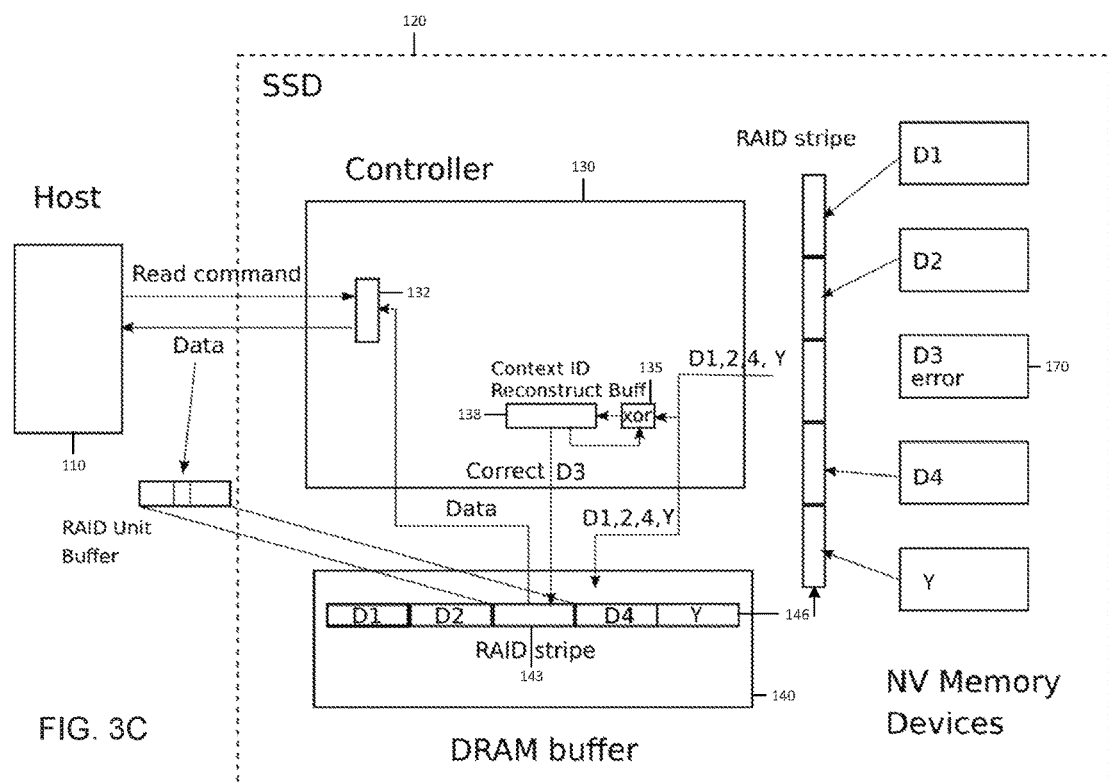
FIG. 3C illustrates a technique of reading data back to the host device from the SSD in FIG. 1 where an unrecoverable error is detected and the controller has initiated a RAID recovery process, according to an embodiment of the present disclosure.

However in certain situations, the reading data from the NV memory devices 150, 160, 170, 180 may result in an unrecoverable error, as depicted in FIG. 3B. Here, the controller 130 reads data from a NV memory device 150, 160, 170, 180 but is either unable to decipher the data, due to a failure in the NV memory device 150, 160, 170, 180, or is unable to correct the number of errors which have occurred in reading the data. As exemplified in FIG. 5B, upon retrieving data unit D3 from NV memory device 170, the controller 130 determines that the number of errors in the data D3 exceeds its error correcting capability and determines that an unrecoverable error has occurred. The controller 130 then initiates the RAID recovery process as shown in FIG. 3C.

When an unrecoverable error has occurred (for example an error in retrieving data page D3), the controller 130 reads the remaining data pages D1, D2, D4 and Y from the NV memory device 150, 160, 180 and 190, and transfers the data to the RAID stripe 146 in the DRAM buffer 140. As previously mentioned, the data pages D1, D2, D4 and Y may be returned in any order according to the access timing and bus activity of the channels to which the memory devices 150, 160, 170, 180 and 190 are attached. Once the first data page is retrieved from the NV memory, e.g. data page D1, the controller 130 identifies that this is the first address accessed by the RAID stripe 146 and uses the associated context identifier C_ID to locate the reconstruction buffer for that C_ID. Per FIGS. 2A and 2B, data D1 is loaded into the context identifier reconstruction buffer 138 before being transferred to the RAID stripe 146 in the DRAM buffer 140. On each subsequent retrieval of data D2 and D4, the respective data is XORed with the contents of the context identifier reconstruction buffer 138 before being transferred to the RAID stripe 146 in the DRAM buffer 140. After the last data page is retrieved from the NV memory, the contents of the buffer 138 (D1⊕D2⊕D4⊕P) are written to the RAID stripe 146 in the DRAM buffer 140 as data unit D3. The data within the RAID stripe 146 in the DRAM buffer 140 comprising data page D3 is then returned to the host 110 to satisfy the read request.

Figure 4A:
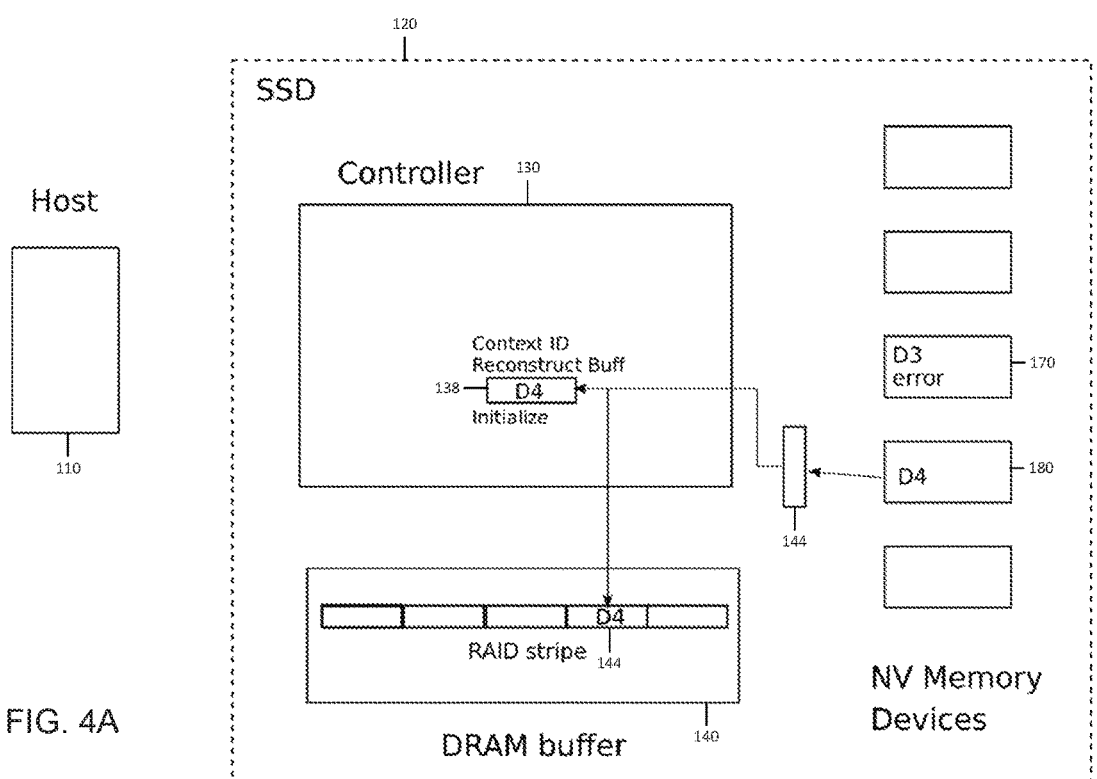
FIGS. 4A-4E illustrate the various stages of data recovery during the read process of FIG. 3C, according to an embodiment of the present disclosure.

FIGS. 4A-E breaks down the reconstruction process of recovering data unit D3 as previously described. When the controller 130 detects an error during retrieval of data from the NV memory 150, it attempts to correct the error (e.g. using error correction codes and the like). When error correction is not possible, the controller 130 determines that the error is unrecoverable and initiates a RAID data recovery process. The RAID data recovery involves the retrieval of the remaining data pages of the RAID stripe, i.e. data pages D1, D2, D4 and P. Here the retrieval is performed on the fly where the sequence of arrival of data D1, D2, D4 and P is not important. The controller reads the NV memory and retrieves data page D4 from NV memory device 180 as the first data page, for example, as depicted in FIG. 4A. Data page D4 is read into and subsequently stored in unit 144 in the RAID stripe 146 in the DRAM buffer 140. The data page D4 is also simultaneously read into the context identifier reconstruction buffer 138. Data page D4 initializes the context identifier reconstruction buffer 138 as it is the first to be read into the buffer 138 following the detection of the unrecoverable error.

Figure 4B:
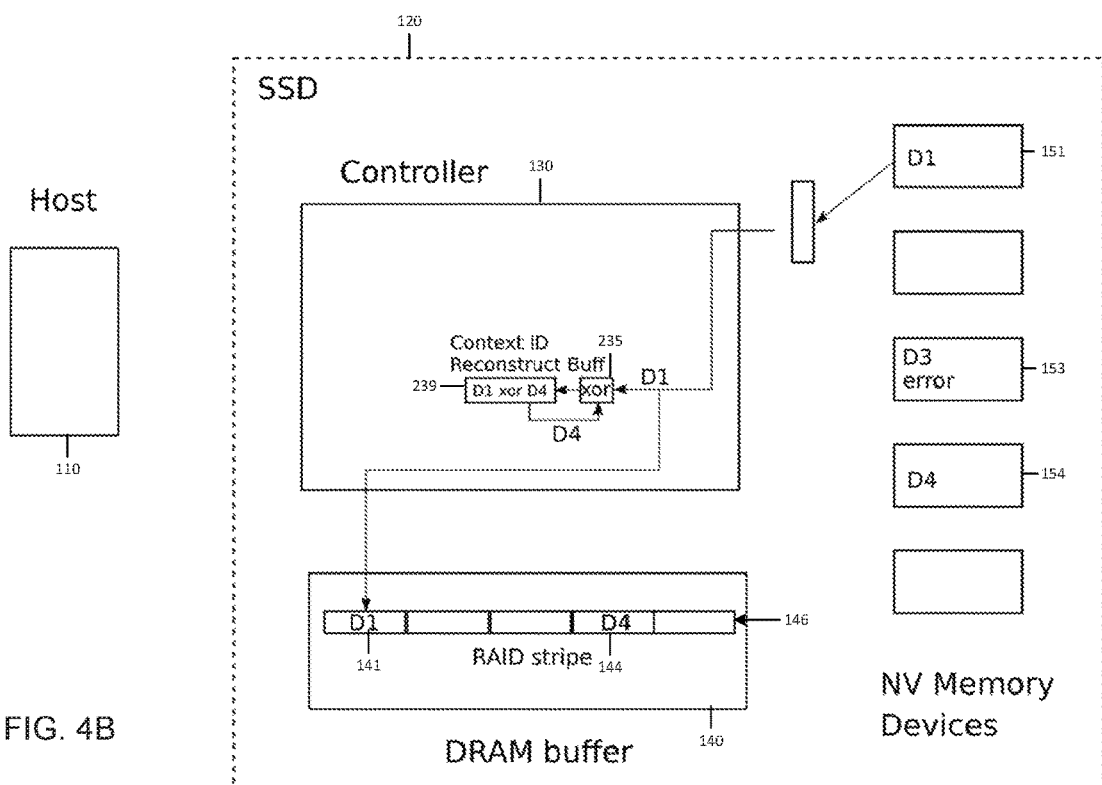

Subsequent to the retrieval of data D4, data D1 is retrieved from the NV memory by the controller 130. In a similar manner, data D1 is read into the unit 141 in the RAID stripe 146 in the DRAM buffer 140, and, as the data D1 is not the first data unit to be retrieved of the remaining data units of the RAID stripe, it is simultaneously XORed with the previous contents of the buffer 138, i.e. D1 is XORed with D4, and the Boolean combination D1⊕D4 replaces the contents of the buffer 138, as illustrated in FIG. 4B.

Figure 4C:
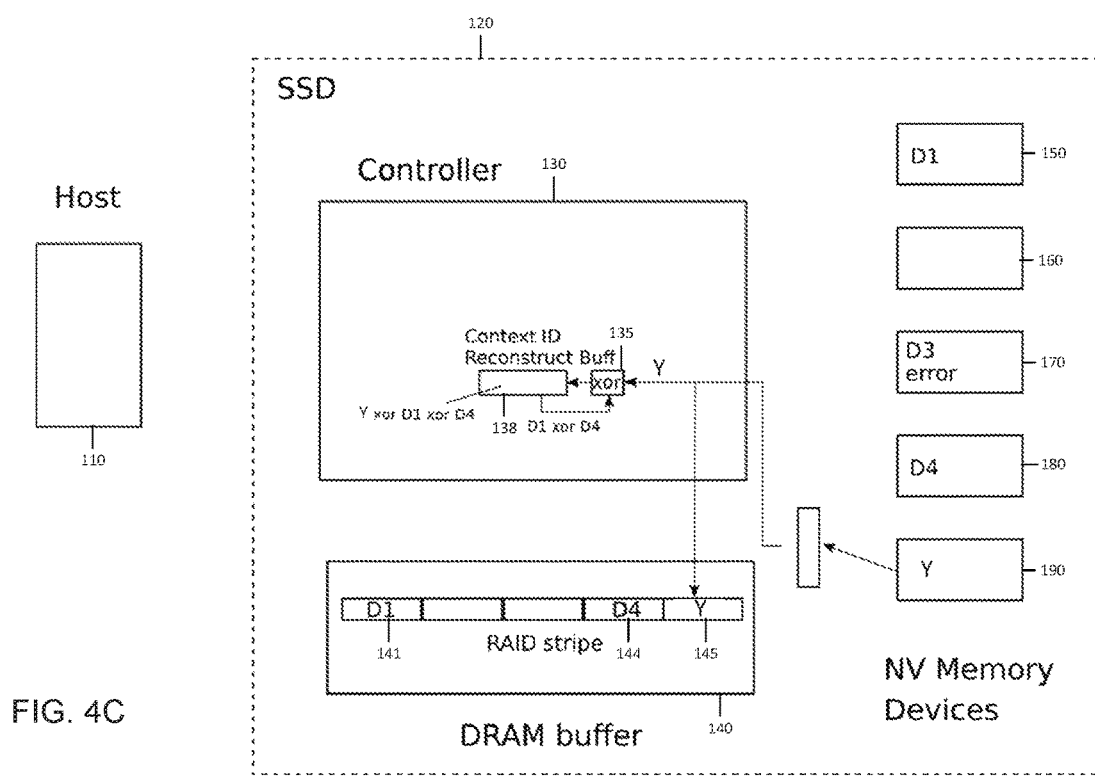
Figure 4D:
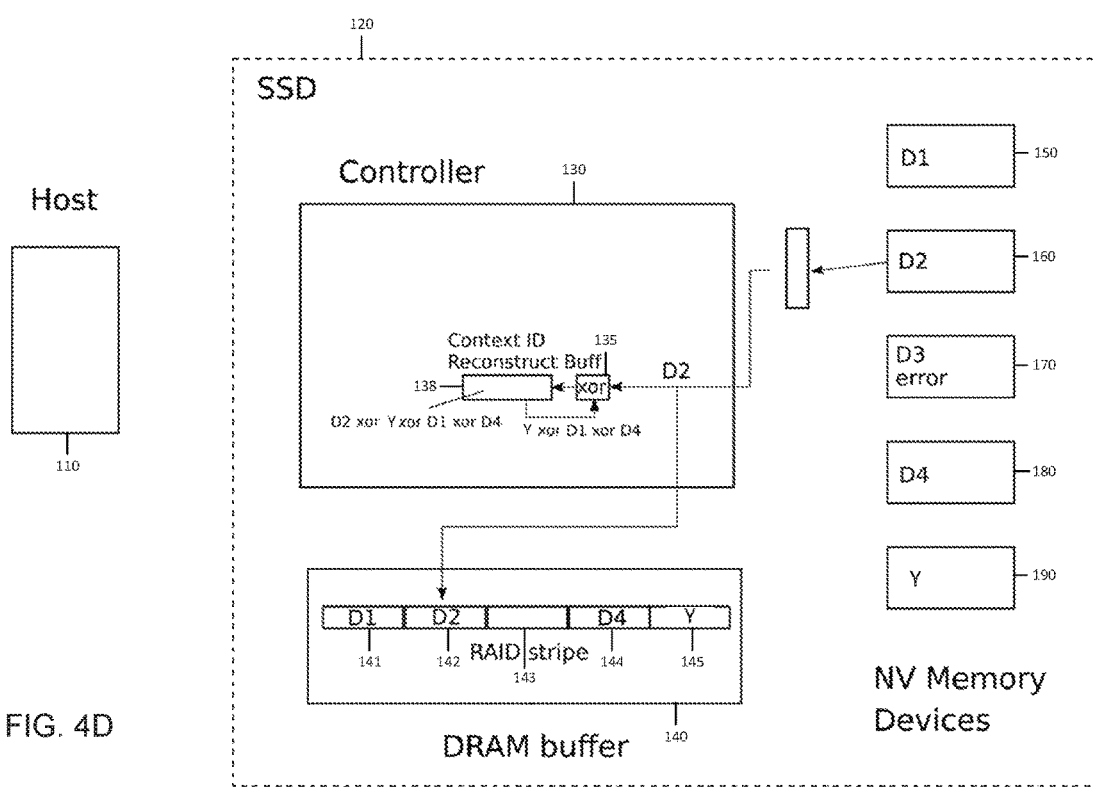

Suppose the next data page to be retrieved from the NV memory is the parity information Y, this data is read into the unit 145 in the RAID stripe 146 in the DRAM buffer 140, as well as simultaneously being XORed with the previous contents of the context identifier reconstruction buffer 138, i.e. Y is XORed with D1⊕D4, and the Boolean combination Y⊕D1⊕D4 replaces the contents of the buffer 138, as illustrated in FIG. 4C. The final data page to be retrieved from the NV memory is D2, which is then read into unit 142 in the RAID stripe 146 in the DRAM buffer 140, as well as simultaneously being XORed with the contents of the buffer, i.e. D2 is XORed with Y⊕D1⊕D4, and the Boolean combination D2⊕Y⊕D1⊕D4 replaces the contents of the buffer 138, as shown in FIG. 4D.

Figure 4E:
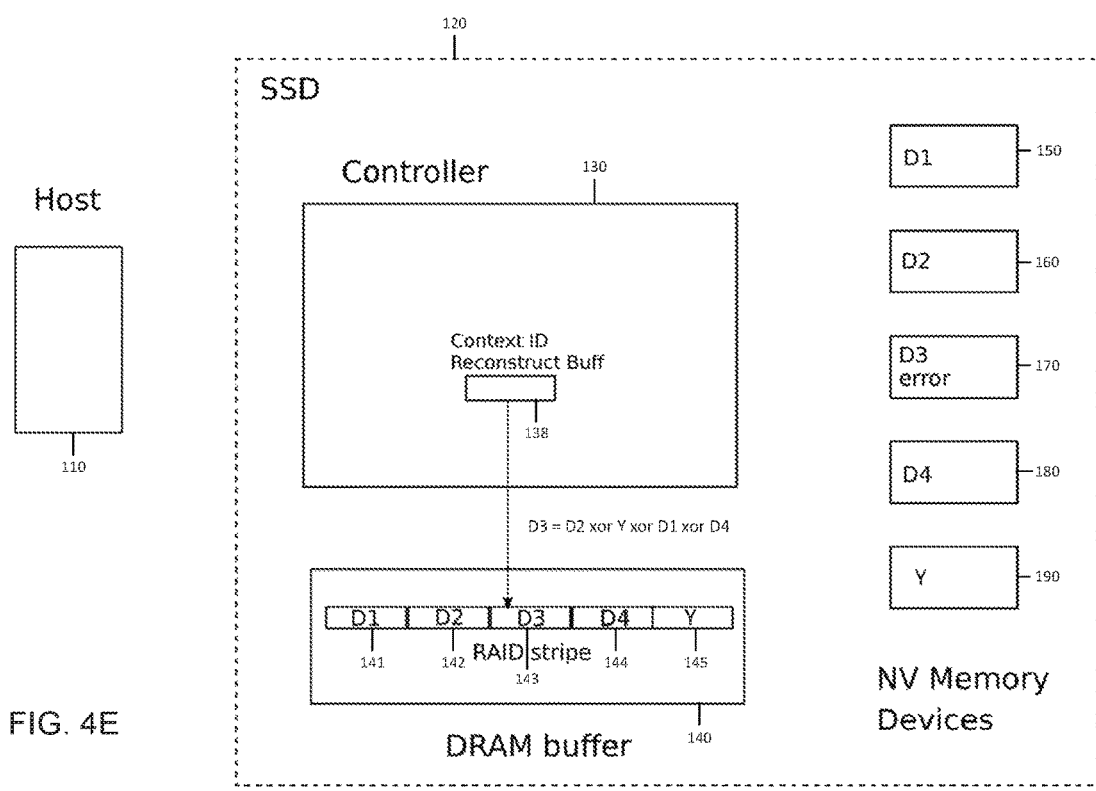

After the data from the NV memory devices 150, 160, 170, 180, 190 have been retrieved, the contents of the context identifier reconstruction buffer 138 is transferred to the RAID stripe 146 and stored as reconstructed data page D3 in RAID unit 143, as shown in FIG. 4E. This reconstructed data D3 is read out to the host 110 to fulfil the read request.

Figure 5A:
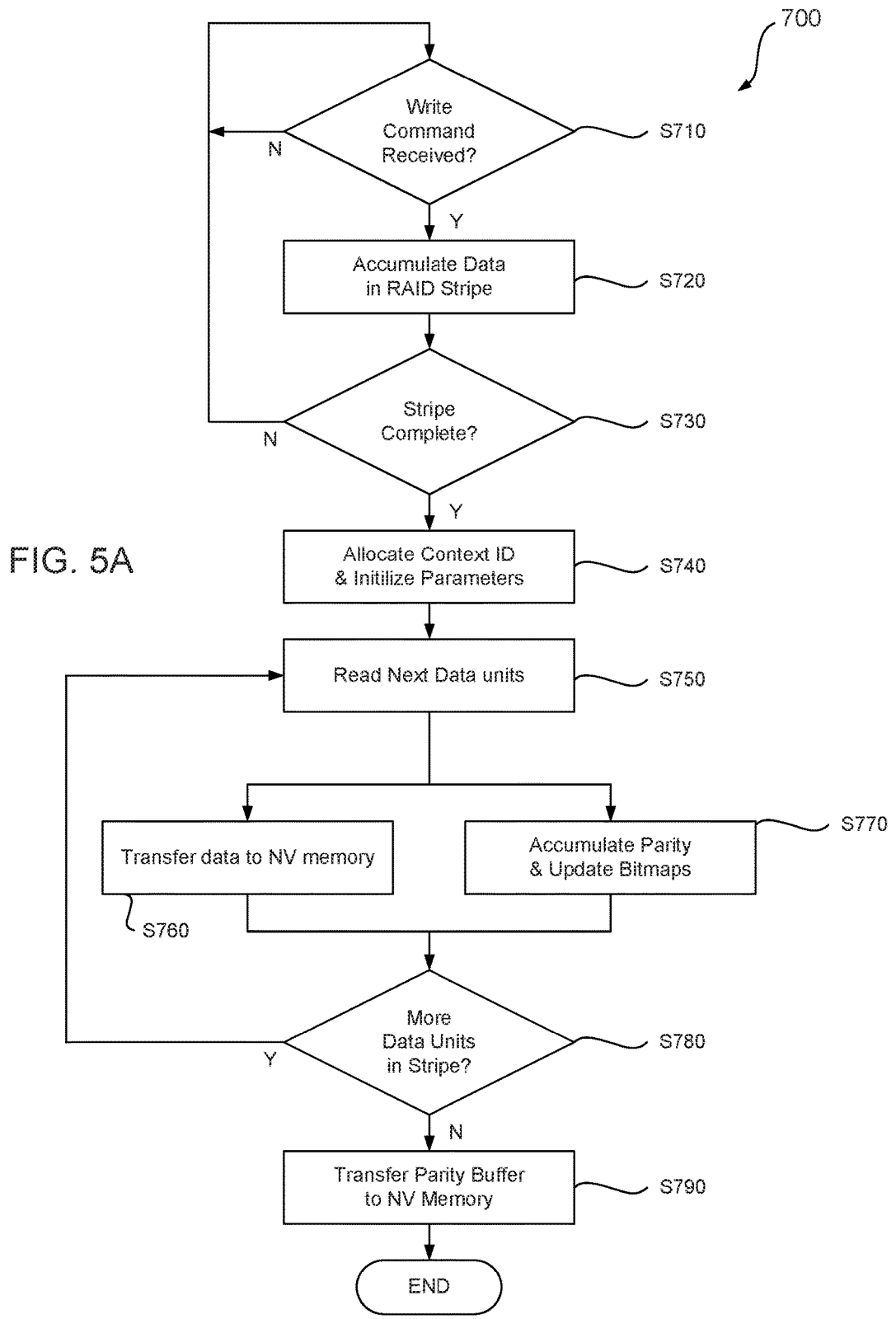
FIG. 5A is a flow diagram of method steps for writing data to the SSD of FIG. 1 according to an embodiment of the present disclosure.

It will be understood that a conventional method of RAID parity calculation and data reconstruction involves the controller first reading from NV memory and buffering in DRAM all of the remaining data pages D1, D2, D4 and Y, then reading back these data pages to perform the XORing function to re-construct the data with the error (D3), saving this reconstructed data page in the RAID stripe before returning the contents of the D3 data unit RAID stripe to the host device. From first reading the data pages from NV memory and saving to the DRAM buffer, this involves four extra data unit reads (from DRAM to the controller) and one extra data unit write (from the controller to the DRAM buffer). This will undoubtedly slow down the readout of data to the host, and would increase the computational strain placed on the controller. The present disclosure alleviates this issue by receiving and XORing the data from the NV memory 150, 160, 170, 180, 190 on the fly, i.e. concurrently with storing it in the DRAM buffer, without the need for an accumulation of D1, D2, D4 and Y before a reconstruction action can be taken by the controller. In addition, the use of a context ID to uniquely associate addresses within the NV memory with a separate and unique XOR buffer in the controller enables multiple read and write NV memory operation to proceed in parallel, with data units from different read or write commands being interleaved in any order A method 700 of writing data to the NV memory 150 with RAID protection will now be detailed with respect to the flow diagram shown in FIG. 5A. This method maps the write process described in relation to FIGS. 2A and 2B. The method 700 begins at step S710 where the controller 120 checks the receiving module 132 for a write request from the host 110. Upon receipt of a write request, the controller 130 accumulates the data received from the host 110, which may be from several separate and unrelated write requests, in the RAID stripe 146 contained in the DRAM buffer 140, as shown in step S720. The data received is stored in the RAID stripe 146 as the form of RAID units 141-144, as shown in FIG. 2A. The controller 130 then checks if the RAID stripe 146 is full, and, if not, goes back to step S710 to receive another write command (step S730). The accumulation of data in the RAID stripe 146 may take place across several, possibly unrelated, write commands. When the RAID stripe is full, the controller 130 allocates context IDs to the data and initializes the parity buffers, per step S740. Initialization of the parity buffers, e.g. parity buffers 236-239 in FIG. 2A, may involve setting the final flag to '0', setting the page bitmap to '1111', and setting the offset bitmap to '0000', as previously described.

After initialization, the controller 130 reads the data in the RAID units 141-144 (step S750) and transfers the data to the NV devices 150, 160, 170, 180 in step S760. At the same time, the data in each RAID unit 141-144 is passed to the XOR modules (e.g. modules 232-235) and the context ID parity buffer (e.g. parity buffers 236-239), as shown in step S770. The parity for each data part transferred is the updated as explained with respect to FIG. 2B above. For example, if the data passed to the XOR module is the first data being passed, the XOR function effectively takes as input the data and a logical zero, which resolves to the data (e.g. P1⊕0=P1; or the context ID parity buffer is otherwise equivalently initialized with the data P1). However when data from succeeding RAID units 141-144 in the RAID stripe 146 are passed to the XOR module, this parity value is then stored in the context ID parity buffer, as shown in step S770. This parity value is determined by performing an XOR of the data being passed to the XOR module and the previous contents of the context buffer 136. In step S770, the final flag, page bitmap and offset bitmap are updated according to FIG. 2B as previously described. In step S780 the controller 130 determines if there are more RAID units to be transferred from the DRAM buffer 140. If there are more RAID units, the method 700 loops back to step S750. If all RAID units have been transferred, the contents of the context ID buffer 136 is transferred as a parity information Y to the NV memory device 190 (step S790), and the method ends.

Figure 5B:
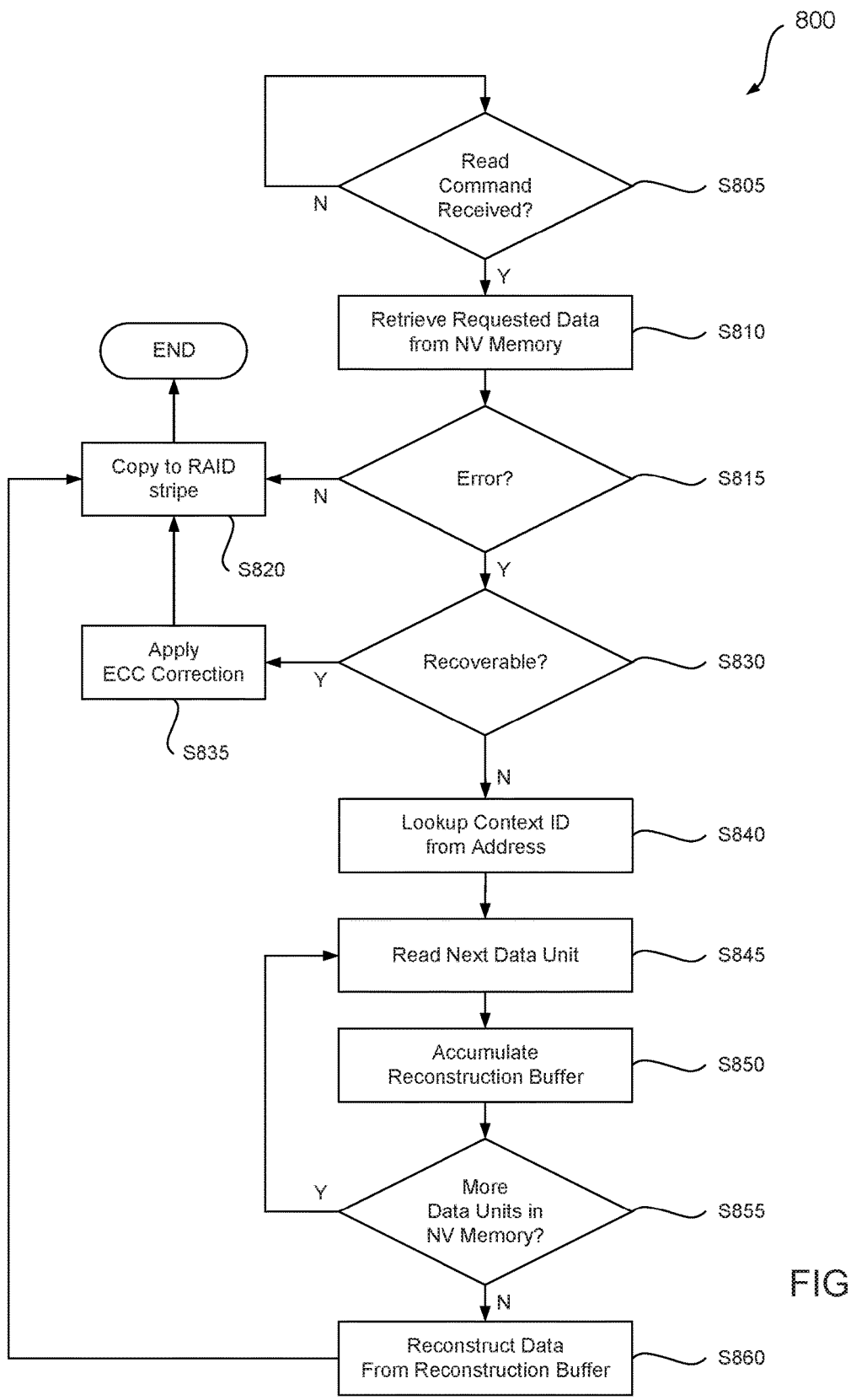
FIG. 5B is a flow diagram of method steps for asynchronously reading data from the SSD of FIG. 1 according to an embodiment of the present disclosure.

A method 800 of reading data from the NV memory 150 with RAID protection will now be detailed with respect to the flow diagram shown in FIG. 5B. The method 800 begins at step S805 where the controller 120 checks the receiving module 132 for a read request from the host 110. Upon receipt of a read request, the controller 130 consults a look up table to determine the location of the requested data in the NV memory 150, 160, 170, 180, after which the controller 130 retrieves the required data (step S810). In step S815, the controller 130 then determines if the retrieved data contains an error. If it does not contain an error, the data is copied to the RAID stripe 146 (step 820), as depicted in FIG. 3A. If the retrieved data contains an error, the controller determines if the error is recoverable in step S830. If the error is recoverable, the controller applies an error correcting code ECC (such as a Hamming or Reed-Solomon code) to the retrieved data in step S835 to recover the data. The recovered data is then transferred to the RAID stripe 146 (step S820). However, if the data retrieved contains an unrecoverable error, the controller 130 proceeds to read in the context identifier C_ID associated with the retrieved data (step 840). The controller reads the remaining data in the same data stripe as the data unit in error. This data is transferred to the RAID stripe 146 in the DRAM buffer 140 (the read of the data unit from NV memory and transfer to DRAM may be done as a single DMA transfer) and, simultaneously, used to initialize the Context ID reconstruct buffer 138. This may be conveniently performed by XORing the data unit with zero and storing the result in the Context ID reconstruct buffer 138. The controller then reads the next data unit in the RAID stripe from NV memory (step S845). The data is transferred to the RAID stripe 146 in the DRAM buffer 140 and, simultaneously, XORed with the previous contents of the Context ID reconstruct buffer 138 and stored in the Context ID reconstruct buffer 138 (step S850). The remaining data units and additionally the parity information (contained in NV memory device 190) are also transferred to the RAID stripe 146 in the DRAM buffer 140, with XORing performed in a similar manner. After each data unit is transferred, the controller determines if there are more data units in the NV memory 150 (step S855), and if there are, the method 800 loops back to step S845. Once all the data units and parity unit corresponding to the C_ID have been XORed into the context identifier reconstruction buffer 138, the Context ID reconstruct buffer will contain the reconstructed data (data unit D3 as depicted in FIG. 4E) which is then copied to the RAID stripe in step S820 for transfer to the host 110, after which the method ends.

Figure 6:
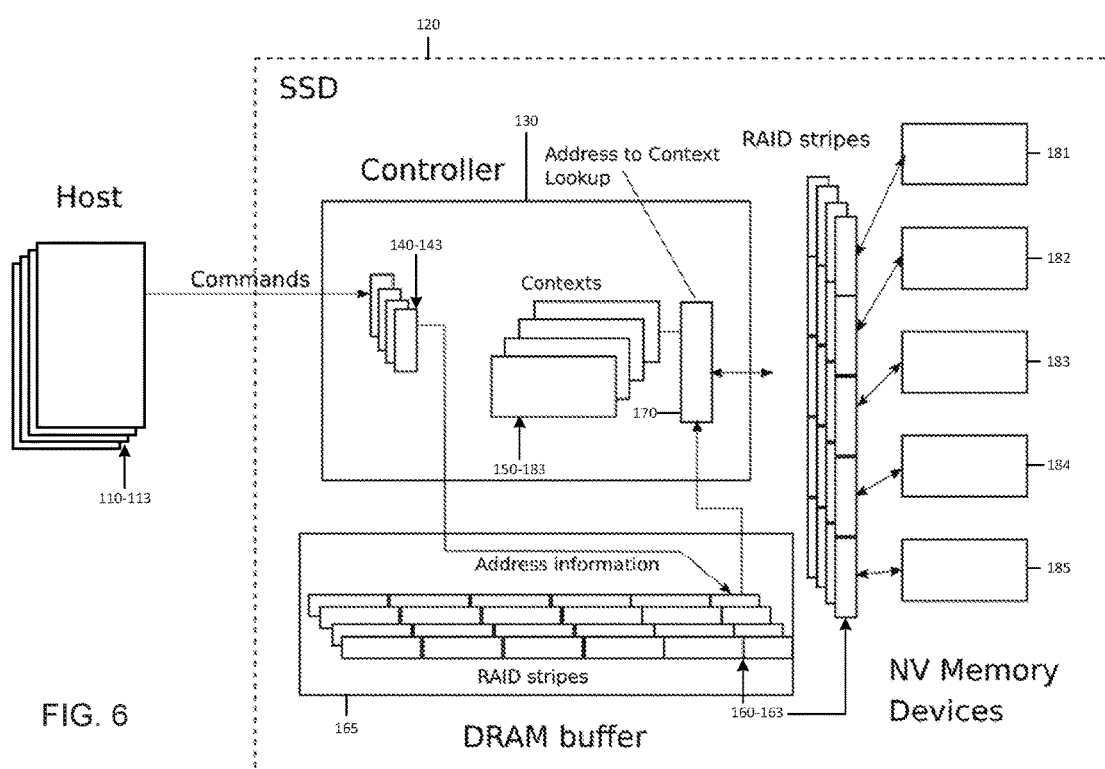
FIG. 6 illustrates the handling of multiple simultaneous read/write commands using multiple RAID stripe contexts, according to an embodiment of the present disclosure.

FIG. 6 depicts the handling of multiple simultaneous read/write commands from at least one host 110-113 according to an embodiment of the present disclosure. As read or write commands arrive at the controller 130 they include address information indicating where the data is to be read or written to within the logical address space within the SSD 120. This address information is buffered along with the buffered RAID stripes 160-163 in the DRAM buffer 165. Multiple RAID stripe contexts 150-153 are then supported by associating the context identifier C_ID with the address and storing these associations in a context lookup table 170 for the active commands from the host 110-113 such that for any data unit to be written or read from the NV memory 180, the address for this read or write instruction can be used to locate the appropriate context for the data unit in question. This allows the processing of data units on the fly, i.e. in any order, from within any particular command and across multiple read or write commands proceeding in parallel.

Other objects, advantages and embodiments of the various aspects of the present invention will be apparent to those who are skilled in the field of the invention and are within the scope of the description and the accompanying Figures. For example, but without limitation, structural or functional elements might be rearranged consistent with the present invention. Similarly, principles according to the present invention could be applied to other examples, which, even if not specifically described here in detail, would nevertheless be within the scope of the present invention.

I claim:

1. A data storage device comprising:
a nonvolatile semiconductor storage array;
a controller in communication with the nonvolatile semiconductor storage array; and
a buffer containing RAID units, the RAID units being in communication with the nonvolatile semiconductor storage array via the controller;
wherein the controller is configured to:
receive write requests from a host device,
accumulate first data relating to the write requests in the RAID units,
concurrently
transfer the first data contained in the RAID units to the nonvolatile semiconductor storage array,
calculate parity values of the first data contained in the RAID units, each parity value relating to each write request,
accumulate the parity values in a context identifier buffer, and
associate context identifiers with the parity values, and
store the parity values and the context identifiers in the nonvolatile semiconductor storage array.

2. The data storage device of claim 1, wherein the first data comprises first data pages that are divided into first data parts.

3. The data storage device of claim 2, wherein the parity values are calculated using the first data parts.

4. The data storage device of claim 3, wherein the context identifier buffer calculates the parity values using the same first data parts of all the first data pages.

5. The data storage device of claim 4, wherein the parity value is calculated by performing a logical XOR operation using the same first data parts of all the first data pages contained in the context identifier buffer.

6. The data storage device of claim 1, wherein the controller is further configured to allocate an identifier to the first data contained in each RAID unit.

7. The data storage device of claim 1, wherein the identifiers comprise at least one of: a final flag, a page bitmap and an offset bitmap.

8. The data storage device of claim 1, wherein the first data in each RAID unit is stored with the identifier in the nonvolatile semiconductor storage array.

9. The data storage device of claim 1, wherein the buffer is a DRAM buffer.

10. The data storage device of claim 1, wherein the RAID units are implemented as RAID 5.

11. A data storage device comprising:
a nonvolatile semiconductor storage array containing first data;
a controller in communication with the nonvolatile semiconductor storage array; and
a buffer containing RAID units, the RAID units being in communication with the nonvolatile semiconductor storage array via the controller;
wherein the controller is configured to:
receive a read request from a host device for a second data stored in the nonvolatile semiconductor storage array;
determine an identifier associated with the requested second data;
determine if the requested second data contains an unrecoverable error;
accumulate first data, including a parity value, contained in the nonvolatile semiconductor storage array associated with the same identifier as the requested second data in a reconstruction buffer, if the requested second data contains an unrecoverable error;
reconstruct the requested second data from the accumulated first data and the parity value; and
transfer the reconstructed second data to the host device via the RAID units.

12. The data storage device of claim 11, wherein the requested second data is reconstructed by performing a logical XOR operation on the accumulated first data and the parity value.

13. The data storage device of claim 11, wherein the controller determines the location of the requested second data in the nonvolatile semiconductor storage array using a look up table.

14. The data storage device of claim 11, wherein the buffer is a DRAM buffer.

15. The data storage device of claim 11, wherein the RAID units are implemented as RAID 5.

16. A method comprising:
receiving, by a controller in communication with a nonvolatile semiconductor storage array, a write request from a host device;
accumulating first data related to the write request in RAID units contained in a buffer, the buffer being in communication with the nonvolatile semiconductor storage array via the controller;
concurrently
transferring the first data contained in the RAID units to the nonvolatile semiconductor storage array,
calculating parity values from the first data contained in the RAID units, each parity value relating to each write request,
accumulating the parity values in a context identifier buffer, and associating context identifiers with the parity values, and
storing the parity values and the context identifiers in the nonvolatile semiconductor storage array.

17. The method of claim 16, wherein the first data comprises first data pages that are divided into first data parts.

18. The method of claim 17, further comprising:
calculating the parity values using the first data parts.

19. The method of claim 18, wherein the context identifier buffer calculates the parity values using the same first data parts of all the first data pages.

20. The method of claim 19, wherein the parity value is calculated by performing a logical XOR operation using the same first data parts of all the first data pages contained in the context identifier buffer.

21. The method of claim 20, further comprising allocating an identifier to the first data contained in each RAID unit.

22. A method comprising:
receiving, by a controller in communication with a nonvolatile semiconductor storage array, a read request from a host device for second data stored in the nonvolatile semiconductor storage array;
determining an identifier associated with the requested second data;
determining if the requested second data contains an unrecoverable error;
accumulating first data, including a parity value, contained in the nonvolatile semiconductor storage array associated with the same identifier as the requested second data in a reconstruction buffer, if the requested second data contains an unrecoverable error;
reconstructing the requested second data from the accumulated first data and the parity value; and transferring the reconstructed second data to the host device via the RAID units.

23. The method of claim 22, further comprising:
performing a logical XOR operation on the first data and the parity value.

24. The method of claim 22, wherein the controller determines the location of the requested second data in the nonvolatile semiconductor storage array using a look up table.

25. A non-transitory computer-readable medium storing instructions that, when executed by a processor, cause the processor to perform a method comprising:
receiving, by a controller in communication with a nonvolatile semiconductor storage array, a write request from a host device;
accumulating first data related to the write request in RAID units contained in a buffer, the buffer being in communication with the nonvolatile semiconductor storage array via the controller;
concurrently
transferring the first data contained in the RAID units to the nonvolatile semiconductor storage array,
calculating parity values from the first data contained in the RAID units, each parity value relating to each write request,
accumulating the parity values in a context identifier buffer, and
associating context identifiers with the parity values, and storing the parity values and the context identifiers in the nonvolatile semiconductor storage array.

26. A non-transitory computer-readable medium storing instructions that, when executed by a processor, cause the processor to perform a method comprising:
receiving, by a controller in communication with a nonvolatile semiconductor storage array, a read request from a host device for second data stored in the nonvolatile semiconductor storage array;
determining an identifier associated with the requested second data;
determining if the requested second data contains an unrecoverable error;
accumulating first data, including a parity value, contained in the nonvolatile semiconductor storage array associated with the same identifier as the requested second data in a reconstruction buffer, if the requested second data contains an unrecoverable error;
reconstructing the requested second data from the accumulated first data and the parity value; and
transferring the reconstructed second data to the host device via the RAID units.

* * * * *